United States Patent
Grunewald et al.

(10) Patent No.: US 8,299,396 B2
(45) Date of Patent: Oct. 30, 2012

(54) METHOD FOR LASER SCRIBING OF SOLAR PANELS

(75) Inventors: Philipp Grunewald, Headington (GB); Phil Rumsby, Bladon (GB)

(73) Assignee: Oerlikon Solar AG, Trubbach, Trubbach (CH)

( * ) Notice: Subject to any disclaimer, the term of this patent is extended or adjusted under 35 U.S.C. 154(b) by 1236 days.

(21) Appl. No.: 12/059,305

(22) Filed: Mar. 31, 2008

(65) Prior Publication Data
US 2008/0237189 A1  Oct. 2, 2008

Related U.S. Application Data

(60) Provisional application No. 60/909,728, filed on Apr. 3, 2007.

(30) Foreign Application Priority Data

Mar. 30, 2007 (DE) .................. 10 2007 015 767

(51) Int. Cl.
*B23K 26/36* (2006.01)
(52) U.S. Cl. .............................. 219/121.69; 219/121.68
(58) Field of Classification Search ............ 219/121.68, 219/121.69, 121.82, 121.67, 121.72; 264/400
See application file for complete search history.

(56) References Cited

U.S. PATENT DOCUMENTS

| | | | |
|---|---|---|---|
| 4,650,524 A | 3/1987 | Kiyama et al. | |
| 4,705,698 A | 11/1987 | Van Dine | |
| 4,734,550 A | 3/1988 | Imanmura et al. | |
| 4,924,064 A * | 5/1990 | Stormbom et al. | 219/121.69 |
| 5,082,791 A * | 1/1992 | Micheels et al. | 438/62 |
| 5,296,674 A * | 3/1994 | Praschek et al. | 219/121.69 |
| 6,422,082 B1* | 7/2002 | Suh | 73/624 |
| 6,559,411 B2 | 5/2003 | Borgeson et al. | |
| 2002/0125230 A1* | 9/2002 | Haight et al. | 219/121.69 |
| 2003/0003690 A1* | 1/2003 | Nering et al. | 438/463 |
| 2003/0047538 A1 | 3/2003 | Trpkovski | |
| 2003/0075531 A1* | 4/2003 | Kupisiewicz | 219/121.69 |
| 2005/0205531 A1* | 9/2005 | Iizuka | 219/121.18 |
| 2007/0084838 A1* | 4/2007 | Hsu | 219/121.82 |
| 2010/0038825 A1* | 2/2010 | McDonald et al. | 264/400 |

FOREIGN PATENT DOCUMENTS

| | | |
|---|---|---|
| DE | 29512519 U1 | 9/1995 |
| DE | 19933703 A1 | 10/2000 |
| JP | 5-23875 A * | 2/1993 |

OTHER PUBLICATIONS

German Search Report for application 10 2007 015 767.5 dated Jun. 29, 2007.

* cited by examiner

*Primary Examiner* — Geoffrey S Evans
(74) *Attorney, Agent, or Firm* — Pearne & Gordon LLP

(57) ABSTRACT

A method and device for ablation of thin layers on the rim region of the surface of a plane substrate coated with a thin film. The rim region runs along the edge or edges of the substrate, and the thin layers should be ablated in at least two, not necessarily unconnected areas of the rim region along edge pieces not parallel to one another. A laser beam is pointed toward an ablation area. The areas of the rim region to be ablated are guided through the area so that in a plane of the surface of the substrate, during the whole ablation process, there is basically a constant distance in the space that lies partly in the ablation area and has its starting point outside the substrate surface and its end point within the substrate surface.

10 Claims, 5 Drawing Sheets

METHOD FOR LASER SCRIBING OF SOLAR PANELS

The invention relates to a method and a device for ablating thin-films on a substrate for solar panels.

BACKGROUND OF THE INVENTION

As a cost effective and therefore interesting alternative to conventional solar modules of crystalline silicon, thin-film solar cells have become known. The substantial elements of a thin-film solar cell consist of a thin-film stack on a glass substrate, the thin-film stack essentially comprising an absorber layer sandwiched between a back electrode and a front electrode. The thin-film-stack needs to be encapsulated so that the delicate thin film materials do not come in contact with the outside environment for both electrical safety reasons and also to prevent deterioration with time when subjected to weather. It is usual to do this by bonding a second piece of glass to the coated side of the substrate. In order that there is no electrical path to the outside edge of the panel and to ensure that the bond between the 2 layers of glass is strong and durable it is necessary to remove the stack of thin films in a border region around the panel edge.

There are different methods known in the art to remove the thin-film stack from the border region, such as sand blasting methods and laser ablation methods.

The sand blasting methods are unreliable and costly as many of the thin-films use materials that require special disposal techniques (eg. CdTe). The recovery of these materials from the sand is difficult and therefore expensive.

Laser ablation techniques are advantageous as no mixture of ablation medium and ablated material is created and recovery of the thin-film materials therefore is no issue.

In U.S. Pat. No. 4,734,500 a laser ablating method is disclosed based on a laser ablation apparatus. Basic elements of such a laser ablation apparatus are a laser oscillator, an optical unit comprising optical elements for manipulating laser light and a table for placing and holding the substrate. The laser oscillator typically emits short pulses of laser light to be used for ablation. The optical elements are used for propagating the light pulses to the surface of the substrate, which is placed on the table. During the ablation process the produced laser light needs to be moved over the surface of the substrate to be machined. Therefore a relative movement of laser beam and the substrate is required. This may be achieved by either moving the substrate with respect to stationary optics or by moving the optics unit with respect to the stationary panel or a combination, using for example CNC X and Y stages.

Figure 1:
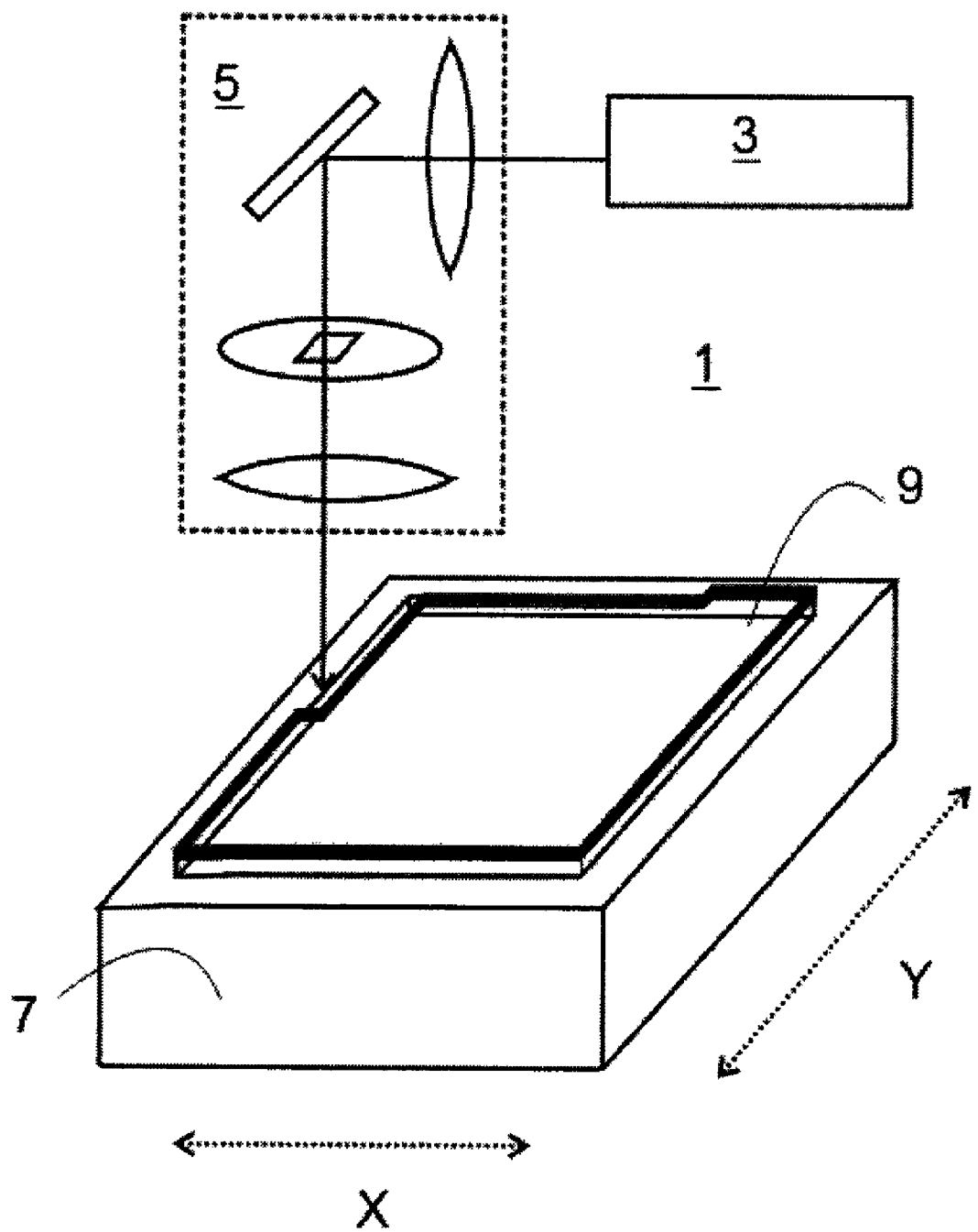

FIG. 1 in U.S. Pat. No. 4,734,550 shows an embodiment where an XY-table is used to move the substrate and the optics unit is stationary. In this case the substrate is maintained in a horizontal orientation with the film side upwards during ablation. This leads to the possibility that for example due to gravity ablated material will be incompletely extracted and will be re-deposited on the surface of the workpiece.

FIG. 12 in U.S. Pat. No. 4,734,550 shows an embodiment where the "table" is vertically suspended from a carry rail. The optical unit is collectively mounted on an X-Y plotter and therefore moving with respect to at least in one direction stationary substrate. At least for ablation, which is performed on the upper part of the workpiece, for example when the thin-film material in a border region along the upper edge is to be removed—this leads to the possibility that ablated material will be incompletely extracted and will be re-deposited on the surface of the workpiece.

Therefore there is a need for a laser ablation apparatus and method which overcomes or at least minimizes the problem of re-deposition.

SUMMARY OF THE INVENTION

The invention is based on the object of providing a device and a method for thin-film ablation of a solar panel permitting cost effective ablation of a border region around the panel edge, the border being typically less than 20 mm wide.

The object can be met with a laser processing method comprising the steps of generating a laser beam, propagating the laser beam to a stationary ablation region, dragging the border region to be ablated through the stationary ablation region in such a way that a vector in plane with the surface of the substrate, the vector pointing away from the substrate and being perpendicular to the edge and the vector being located on the part of the edge which is actually closest to the center of the ablation region essentially points in the same direction during ablation and removing the ablated material from the ablation region in a direction which, if projected onto the plane of the surface is not pointing into the substrate.

By this the optical unit used for propagating the laser pulses to the ablation region as well as additional means for finally absorbing the ablated material may be completely stationary and it is guaranteed that the ablated material is always removed in direction away from the surface of the substrate.

In a preferred embodiment of the present invention the substrate is maintained in a vertical orientation. This has the advantage that this facilitates moving the substrate as required. The ablation region may then be foreseen at the actual lower part of the edge. Gravity forces then support the process of transporting the ablated material away from the substrate. In some cases this effect is sufficient and no additional means need to be foreseen to remove the ablated material.

FIGURE CAPTIONS

FIG. 1 Aparatus for laser ablation as known in the art

Figure 2:
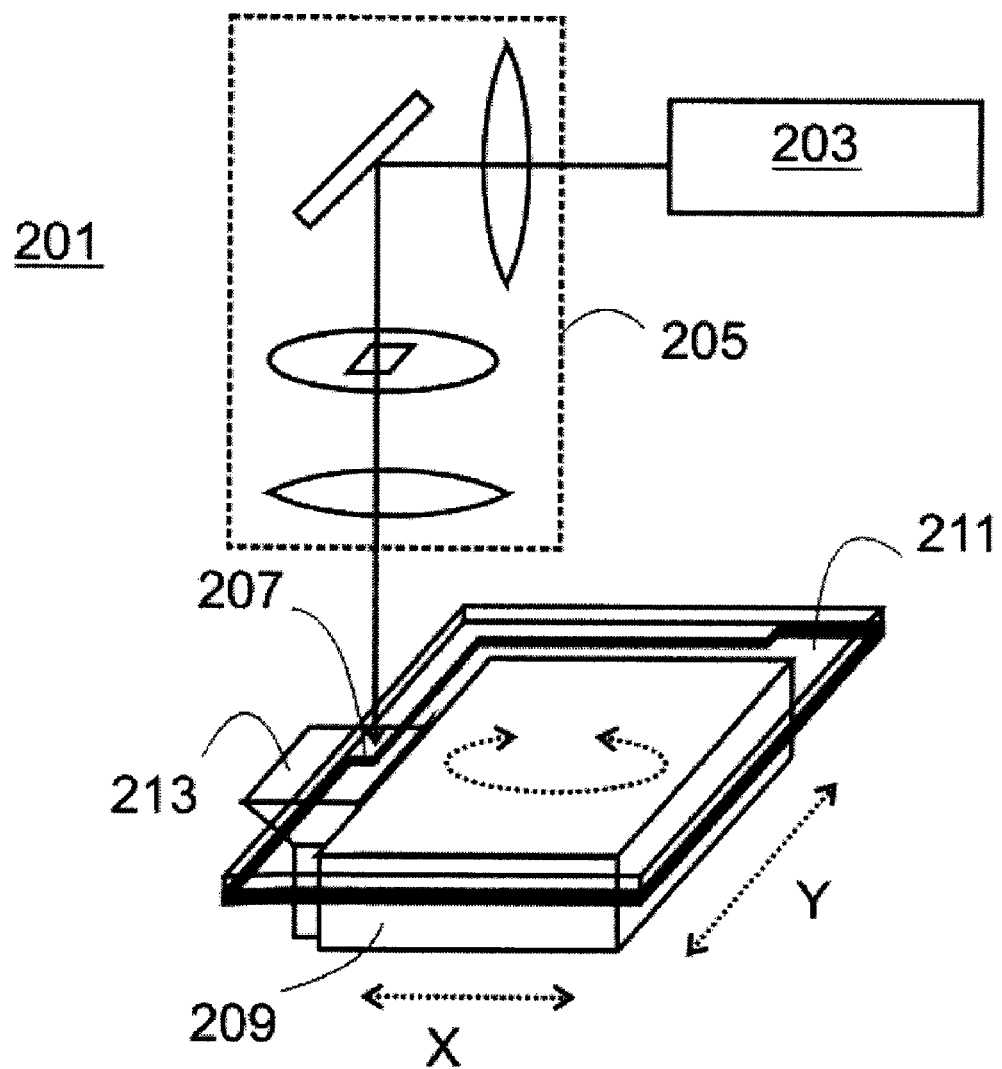
Figure 3:
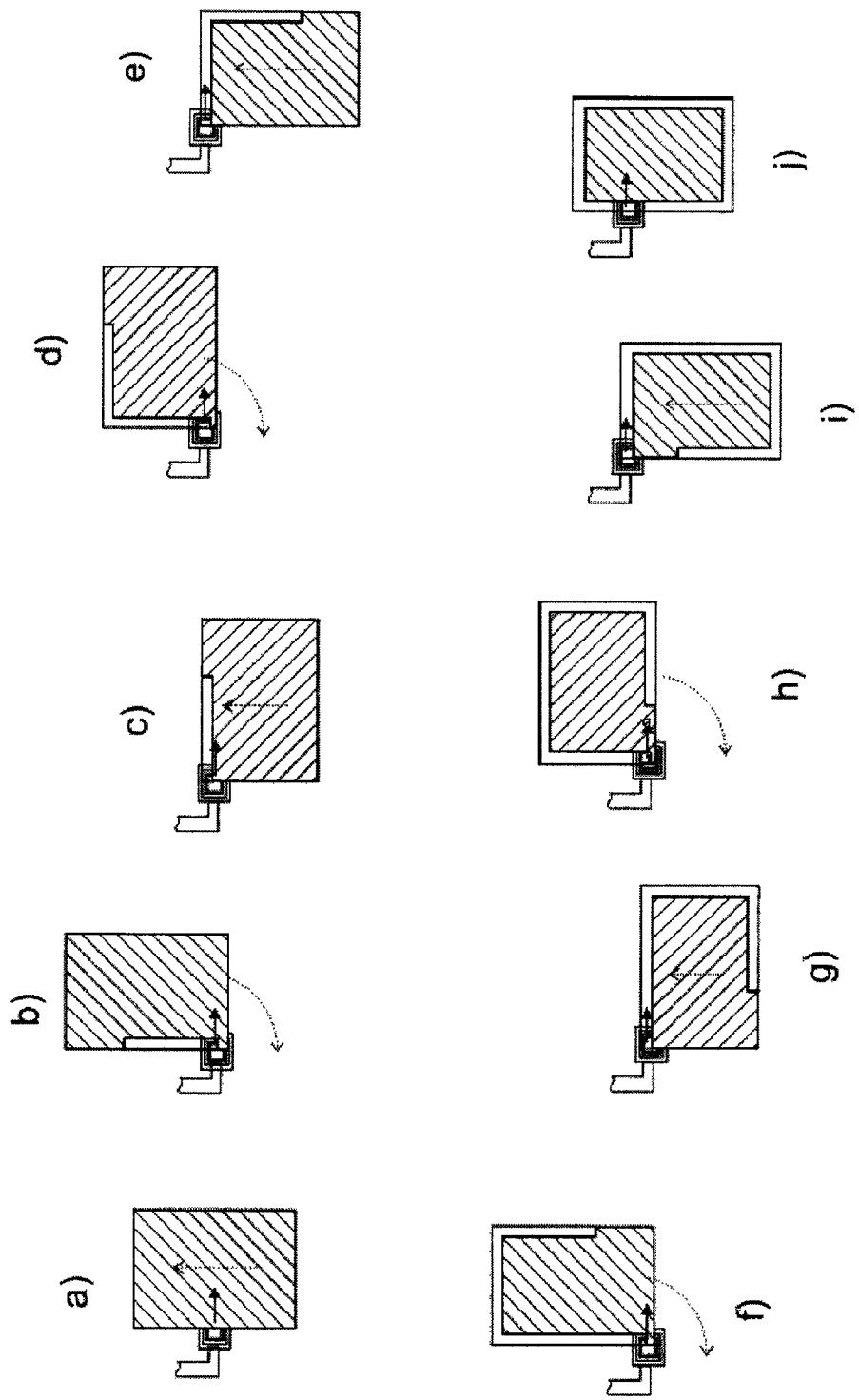
Figure 4:
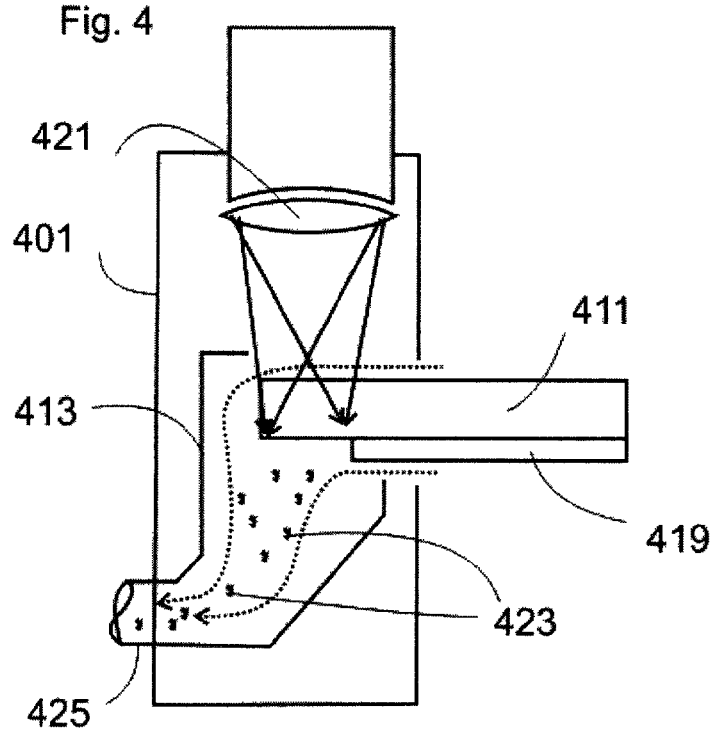
Figure 5:
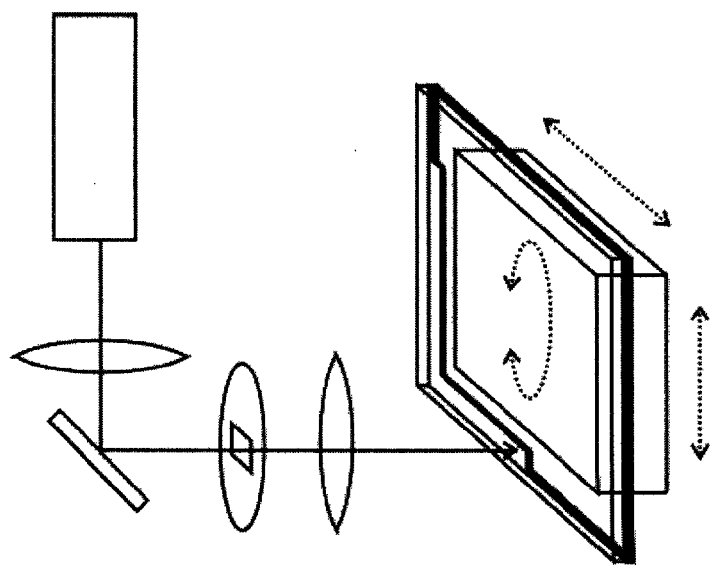
Figure 6:
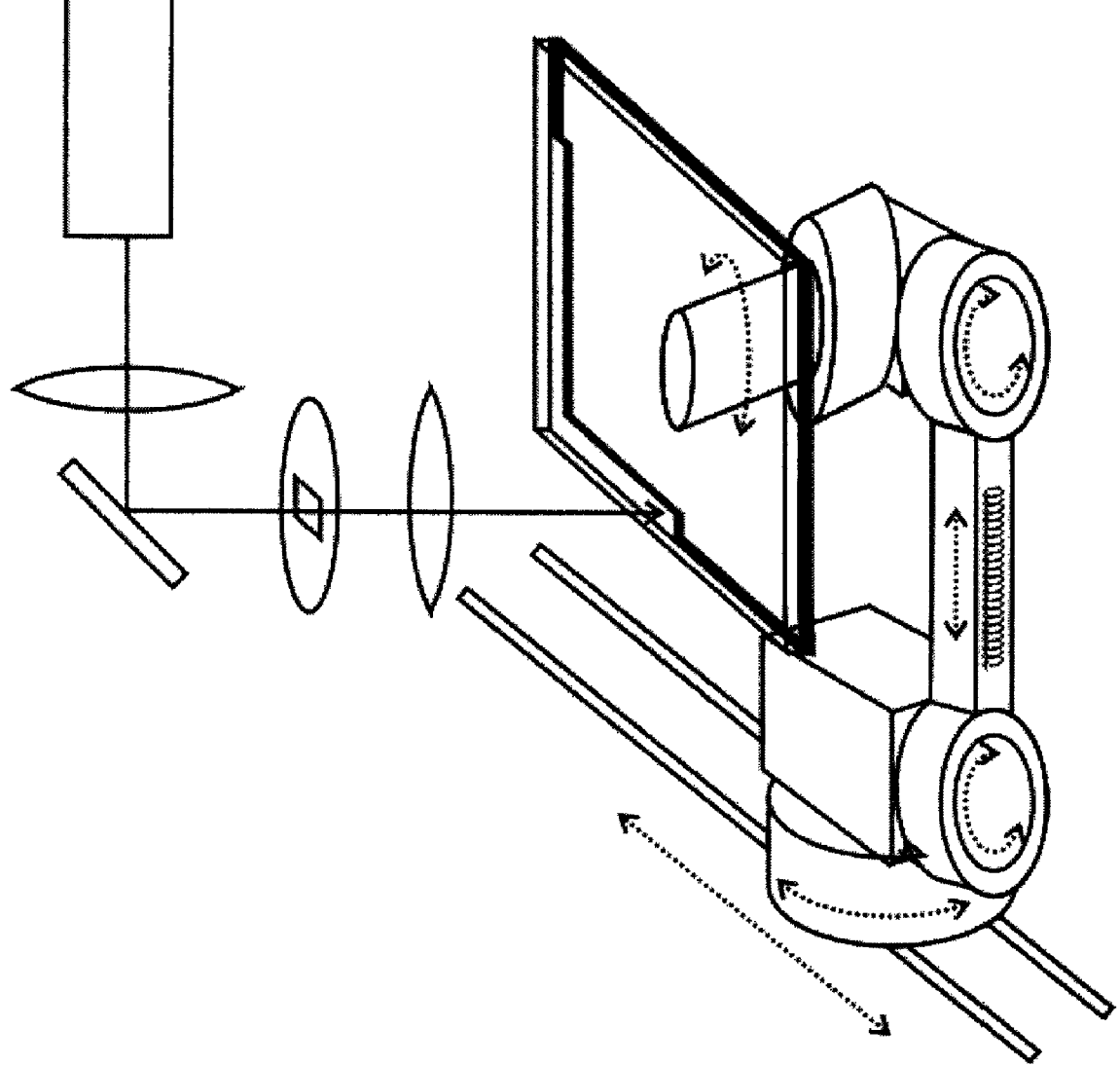

FIG. 2 Embodiment of apparatus according to the present invention with horizontally oriented substrate FIG. 3a-j) Different steps of laser ablation according to the present invention FIG. 4 Ablation head with means for finally removing ablated material FIG. 5 Embodiment of apparatus according to the present invention with vertically oriented substrate FIG. 6 Embodiment of apparatus according to the present invention with a robot.

DETAILED DESCRIPTION OF THE INVENTION

FIG. 1 shows a laser ablation system 1 as is known in the art. This comprises a laser oscillator 3, an optical unit 5 with different optical elements such as mirrors and lenses and a table 7 movable along the x and y.

The optical unit 5 transmits the laser pulse generated by the laser oscillator 3 to a region on the surface of the coated substrate 9 lying with its backside on the table 7, thereby defining the ablation region.

As the coating is on top of the substrate directly facing the laser beam, there is the disadvantage that material ablated by the laser pulse may, due to gravity forces with high probability be re-deposited on the substrate thereby causing impurities and problems.

FIG. 2 shows a first embodiment of the present invention. Shown is a laser ablating system 201 with a laser oscillator 203 and an optical unit 205 transmitting the laser pulses produced by the laser oscillator 203 to an ablation region 207. The laser ablation system 201 according to this first embodiment comprises a table 209 for horizontally holding a coated substrate 211. The table 209 can be moved in two horizontal directions x and y, but in addition can be rotated around a vertical axis. This is indicated in FIG. 2 by the broken arrows.

In the ablation process according to the first embodiment of the present invention, the coated substrate 211 is placed on the table 209 in such a way, that the coated surface of the substrate is facing down in direction to the gravity forces. The size of the table 209 is chosen to be small enough to ensure that the substrate 211 with the entire border region to be ablated is clearly extending beyond the table. In addition the coated substrate 211 is placed on the table in such a manner that the coating is facing to the ground and the laser ablation is performed through the substrate. This means that the laser pulse is transmitting through the substrate before hitting the thin-film coating. Shown in FIG. 2 as well are means 213 for finally absorbing the ablated material. Due to gravity the ablated material will in principle move downwards. Therefore the means 213 may just comprise a container for collecting the material. However, preferably the means generates a gas flow into the container thereby actively at least supporting the process to absorb the ablated material.

FIG. 3a to 3j show a sequence of how the ablation process is performed. In top view is shown the coated substrate and the means for finally absorbing the ablated material. Coated areas of the substrate are hatched and areas where material was ablated are transparent. In the example ablation is started somewhere in the middle of the long edge of the substrate, shown in FIG. 3a. Ablation is performed while sliding the substrate in linear translation until the first corner of the substrate is reached, as shown in FIG. 3b. The substrate is then rotated into position shown in FIG. 3c. Note that this rotation involves rotation of the table as well as translations in x and y directions. Ablation is then performed while sliding the substrate in linear translation until the second corner is reached, as shown in FIG. 3d. The substrate is then rotated into position shown in FIG. 3e. Again ablation is performed while sliding the substrate in linear translation until the third corner is reached as shown in FIG. 3f. The substrate is then rotated into position shown in FIG. 3g. Again ablation is performed while sliding the substrate in linear translation until the fourth corner is reached as shown in FIG. 3h. The substrate is then rotated into position shown in FIG. 3i. Ablation is then performed while sliding the substrate until the starting position is reached as shown in FIG. 3j.

In all the FIGS. 3a to 3j is indicated a small vector (not broken line). This vector defines a—during the ablation process—constant directional line in space with a tail outside the substrate and a tip within the substrate. With this vector it may be seen that this is a method for ablating thin films in the border region of the surface along the edge of a plane thin-film coated substrate, the method comprising the following steps:
  providing a laser beam
  guiding the laser beam to a stationary ablation region
  sliding the border region to be ablated through the ablation region in such a way that there exists a vector, based in the center of the stationary ablation region, the vector being essentially stationary throughout the ablation process the vector essentially always pointing in the inner of the surface surrounded by the edge of the substrate.

FIG. 4 shows an example of such means for finally removing the ablated material. An ablation head 401 is shown comprising a lens 421 as part of the optical unit. The ablation head 401 comprises as well a container 413 close to the border region of a substrate 411 with thin film coating 419. The container 13 as shown comprises as well a tube 425 for sucking ablated material 423. The geometry of the container 13 is chosen in such a way that pressure below atmospheric pressure in the tube generates a gas flow from both sides of the substrate to the tube, thereby carrying away the ablated material from the substrate. The ablation head 401 may as well comprise means for absorbing the laser light which transmitted through the substrate without being absorbed. Such means are not shown in FIG. 4.

As becomes clear from the description above, the possibility of the table to be rotated is crucial. Only with such a rotatability of the table the ablation head 401 as shown in FIG. 4 may be completely stationary.

According to another embodiment of the present invention, the substrate is held in a vertical orientation. This is shown in FIG. 5. The ablation process is then conducted in such a way that the ablation region is always at the lower edge of the substrate. By this, due to gravity forces the ablated material is falling down and therefore away from the substrate surface. In this configuration the coated surface of the substrate may be facing to the optical unit or to the table, as gravity drags the ablated material away from the substrate in both cases. However there might be a slight advantage in having the coating facing the table because then it is clear that the ablated material does not interact with laser light, still to be used for ablation. It is again of importance to have a holder of the substrate which is rotatable around an axis perpendicular to the surface of the substrate. Only by this it is possible to keep the ablation region at the lowest edge of the surface. Holding the substrate may be realized by a mechanism working with low pressure.

FIG. 6 shows an embodiment of the present invention where the holding table is replaced by a robust multi axis industrial robot. With such a robot not only the steps as shown in FIG. 3 may be performed, but also the efficient loading and unloading of the substrate is possible. In addition the use of a robot allows the substrate to be held by means of a device at the end of the robot arm which attaches to the uncoated side of the substrate yet still allows the coated surface of the substrate to face away or towards the optical unit, the former arrangement being preferred because then it is clear that the ablated material does not interact with laser light, still to be used for ablation The different embodiments helped to explain the invention by examples without limiting the scope of the invention to these examples.

From these examples it should have become clear that the apparatus according to the present invention is an apparatus for ablating thin films in the border region of the surface along the edge or edges of a plane thin film coated substrates, the apparatus comprising
  a laser oscillator for providing laser light
  an optical unit for guiding the light to an ablation region
  a substrate holder for holding substrates, the substrate holder being of such a kind that if a substrate is attached to the substrate holder linear movements essentially parallel to the surface of the substrate may be performed in two linear independent directions
  characterized in that the substrate holder being of such a kind that if a substrate is attached to the substrate holder it may be rotated around an axis which is essentially normal to the substrate surface.

With such an apparatus the method according to the present invention may be performed which is a method for ablating thin films in the border region of the surface along the edge or edges of a plane thin-film coated substrate, wherein ablation of said thin films is being effected in at least two, not necessarily noncoherent areas of the border region alongside edge-sections not being parallel to each other, the method comprising the following steps:

providing a laser beam guiding the laser beam to a ablation region sliding the areas of the border region to be ablated through the ablation region in such a way that there exists in the plane of the surface of the substrate a during the ablation process essentially constant directional line in space, said line resting partially in the ablation region and having its tail outside the substrate and its tip within the substrate.

As already described it is possible maintain the substrate essentially in vertical orientation during the ablation process and to move the substrate in such a way that during ablation the ablation region is always at the actual lower edge of the substrate. For this it may be of advantage to use a multiaxial robot.

Preferably the substrate is hold with means which interact with the surface of the substrate only in regions well spaced apart from the border region.

What is claimed is:

1. A method of ablation of thin layers on a border region of the surface of a plane substrate coated with a thin film to define a coated surface, whereby the border region runs along the edge or edges of the substrate, and the thin layers on the border region in a region to be ablated are ablated according to the method comprising steps of:

preparing a laser beam emitted from an optical unit;

pointing the laser beam to establish an ablation region;

supporting the substrate such that the coated surface faces away from the optical unit;

guiding the region to be ablated through the ablation region so that a vector in the plane of the surface of the substrate is essentially invariant, and has its starting point outside the substrate surface and its end point within the substrate surface during the whole ablation process, while keeping the substrate in an essentially vertical orientation during the ablation process; and moving the substrate such that the ablation region is always on the lower edge of the substrate.

2. The method in claim 1, characterized by the fact that a multiaxial robot is used to perform the substrate movements necessary for ablation.

3. The method in one of the preceding claims, characterized by the fact that the substrate is held with means that interact slightly with the inner regions of the surface, which are some distance away from the rim regions.

4. The method of claim 1, wherein the laser beam is pointed such that the beam travels through the substrate before traveling through the thin layers.

5. The method of claim 1, wherein the step of pointing the laser beam comprises pointing the beam through a region of the substrate extending beyond an outer edge of the substrate holder.

6. The method of claim 1, further comprising the steps of generating a gas flow from both sides of the substrate to a tube and carrying away ablated material from the substrate to a container.

7. A device for ablation of thin layers on a border region of the surface of a plane substrate coated with a thin-film, whereby the border region runs along the edge or edges of the substrate, whereby the device includes a laser for producing laser light for ablation;

an optical unit for pointing the light to establish an ablation region;

a substrate holder to hold the substrate in an essentially vertical orientation during an ablation process, whereby the substrate holder is designed so that, when the substrate is held, linear movements can be made basically parallel to the plane of the substrate characterized by the fact that the substrate holder is designed so that when the substrate is held, it is possible to rotate it on an axis basically perpendicular to the surface of the substrate, wherein the optical unit and the substrate holder are both on the same side of the substrate and the optical unit is disposed to point the light through a region of the substrate extending beyond an outer edge of the substrate holder.

8. The device of claim 7, further comprising:

a container; and a tube that generates a gas flow from both sides of the substrate to the tube, thereby carrying away ablated material from the substrate to the container.

9. The device of claim 7, wherein the optical unit is disposed to point the light below the substrate holder.

10. The device of claim 7, the substrate holder is mounted to a multiaxial robot used to perform substrate movements necessary for ablation.

* * * * *